(12) United States Patent
Brown et al.

(10) Patent No.: US 7,095,044 B2
(45) Date of Patent: Aug. 22, 2006

(54) FIELD EFFECT TRANSISTORS AND MATERIALS AND METHODS FOR THEIR MANUFACTURE

(75) Inventors: Beverley Anne Brown, Manchester (GB); Domenico Carlo Cupertino, Manchester (GB); Janos Veres, Manchester (GB); John David Schofield, Manchester (GB); Stephen William Leeming, Manchester (GB); Stephen George Yeates, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 2 days.

(21) Appl. No.: 10/416,005

(22) PCT Filed: Nov. 21, 2001

(86) PCT No.: PCT/GB01/05145

§ 371 (c)(1),
(2), (4) Date: May 6, 2003

(87) PCT Pub. No.: WO02/45184

PCT Pub. Date: Jun. 6, 2002

(65) Prior Publication Data

US 2004/0038459 A1    Feb. 26, 2004

(30) Foreign Application Priority Data

Nov. 28, 2000 (JP) .................................. 0028867.0

(51) Int. Cl.
H01L 29/08 (2006.01)
(52) U.S. Cl. .......................................... 257/40; 438/99
(58) Field of Classification Search ................. 438/99; 257/40
See application file for complete search history.

(56) References Cited

U.S. PATENT DOCUMENTS

| | | | |
|---|---|---|---|
| 3,963,498 A | 6/1976 | Trevoy | 96/87 |
| 4,687,589 A | 8/1987 | Block et al. | 252/73 |
| 5,290,963 A | 3/1994 | Mishima et al. | 556/413 |
| 5,352,554 A | 10/1994 | Mishima et al. | 430/59 |
| 5,405,725 A | 4/1995 | Nakamura et al. | 430/58 |
| 5,482,811 A | 1/1996 | Keoshkerian et al. | 430/135 |
| 5,500,537 A | 3/1996 | Tsumura et al. | 257/40 |
| 5,516,617 A | 5/1996 | Petropoulos et al. | 430/133 |
| 5,531,872 A | 7/1996 | Forgit et al. | 204/486 |
| 5,563,261 A | 10/1996 | Keoshkerian et al. | 540/141 |
| 5,783,519 A | 7/1998 | Morrison et al. | 503/227 |
| 5,876,887 A | 3/1999 | Chambers et al. | 430/58 |
| 5,946,551 A | 8/1999 | Dimitrakopoulos et al. | 438/99 |
| 6,107,117 A | 8/2000 | Bao et al. | 438/99 |
| 6,165,660 A | 12/2000 | Chambers et al. | 430/56 |
| 6,180,309 B1 | 1/2001 | Maty et al. | 430/130 |
| 6,252,245 B1 | 6/2001 | Katz et al. | 257/40 |
| 6,319,645 B1 | 11/2001 | Murti et al. | 430/58.65 |
| 6,558,573 B1 | 5/2003 | Hanna et al. | 252/299.3 |
| 6,639,281 B1 | 10/2003 | Kane et al. | 257/350 |
| 6,774,393 B1 | 8/2004 | Murti et al. | 257/40 |
| 6,783,697 B1 | 8/2004 | Hanna et al. | 252/299.3 |
| 2001/0008271 A1* | 7/2001 | Ikeda et al. | 250/370.09 |
| 2002/0058157 A1* | 5/2002 | Doi et al. | 428/690 |
| 2002/0135039 A1 | 9/2002 | Yang | 257/499 |
| 2003/0151026 A1* | 8/2003 | Hanna et al. | 252/299.3 |
| 2003/0227014 A1 | 12/2003 | Murti et al. | 257/40 |

FOREIGN PATENT DOCUMENTS

| | | |
|---|---|---|
| DE | 195 44 977 A1 | 6/1996 |
| EP | 0 478 380 A1 | 4/1992 |
| EP | 0 528 662 A1 | 2/1993 |
| EP | 0 910 100 A2 | 4/1999 |

OTHER PUBLICATIONS

Borsenberg, Paul M. et al, "High-Mobility Doped Polymers", Jpn. J. Appl. Phys. vol. 34, pp. L 1597-L 1598, Part 2, No. 12A, Dec. 1, 1995.
Tecklenburg, Rita, et al, "Theory of Organic Field Effect Transistors", Advanced Materials for Optics and Electronics, Adv. Mater. Opt. Electron, vol. 8, p. 285-294, May 27, 1998.
Geens, W. et al., "Field Effect Mobility Measurements of Conjugater Polymer/Fullerene Photovoltaic Blends", XP 008001919, pp. 516-520.
Aeronouts, T., et al, "Analysis and simulation of the IV-characteristics of PPV-oligomer based Schottky diodes", Synthetic Metals 122 pp. 153-155, 2001, XP-0010663555.
Brabec, C.J. et al, "Photoinduced FT-IR spectroscopy and CW-photocurrent measurements of conjugated polymers and fullerenes blended into a conventional polymer matrix", Solar Energy Materials & Solar Cells, 61, pp. 19-33, 2000.

* cited by examiner

Primary Examiner—Carl Whitehead, Jr.
Assistant Examiner—Colleen E. Rodgers
(74) Attorney, Agent, or Firm—Morgan Lewis & Bockius LLP

(57) ABSTRACT

A field effect transistor in which a continuous semiconductor layer comprises:
 a) an organic semiconductor; and,
 b) an organic binder which has an inherent conductivity of less than $10^{-6} Scm^{-1}$ and a permittivity at 1,000 Hz of less than 3.3
and a process for its production comprising:
coating a substrate with a liquid layer which comprises the organic semiconductor and a material capable of reacting to form the binder; and,
converting the liquid layer to a solid layer comprising the semiconductor and the binder by reacting the material to form the binder.

10 Claims, No Drawings

FIELD EFFECT TRANSISTORS AND MATERIALS AND METHODS FOR THEIR MANUFACTURE

The present application claims the benefit of PCT/GB01/05145, filed Nov. 21, 2001, which claims the benefit of British Patent Application 0028867.0, filed Nov. 28, 2000.

BACKGROUND OF THE INVENTION

This invention relates to Field Effect Transistors (FETs) and materials and methods for their manufacture.

Conventional FETs are electronic devices which are capable of modulating the current between two electrodes called the drain and the source by the application of a voltage on a third electrode called the gate. The current is modulated by accumulating or depleting charge carriers in a semiconductor channel between the drain and the source. In conventional FETs inorganic semiconductors such as Si or GaAs have been used for the channel material. FETs find use in a number of applications at present such as in the active drive matrix for large area displays. However, FETs using inorganic materials are often difficult and expensive to manufacture due to the high temperature processing conditions and vacuum required to give uniform devices over large areas.

Currently there is great interest in replacing the inorganic materials with cheaper organic compounds (*J. Mater. Chem.*, 1997, 7(3), 369–376 and 1999, 9, 1895–1904). A number of organic π-conjugated materials have been used as the active layer in FETs (*Current Opinion in Solid State & Materials Science*, 1997, 2, 455–461 and *Chemical Physics*, 1998, 227, 253–262); however, none of these materials has been found to be completely satisfactory for practical applications because they have poor electrical performance, are difficult to process in large scale manufacture, or are not sufficiently robust to attack by atmospheric oxygen and water, which results in short life-time of the device. For example, pentacene has been reported to give very high field effect mobilities but only when deposited under high vacuum conditions (*Synth. Metals*, 41–43, 1991, 1127). A soluble precursor route has also been reported for pentacene which allows liquid processing, but this material then requires subsequent heating at relatively high temperatures (140° C.–180° C.) in-vacuum to form the active layer (*Synth. Metals*, 1997, 88, 37–55). The final performance of the FET formed using this process is very sensitive to the substrate and the conversion conditions, and has very limited usefulness in terms of a practical manufacturing process. Conjugated oligomers such as α-sexithiophene (*Synth. Metals*, 54, 1993, 435 and *Science*, 1994, 265, 1684) are also reported to have high FET mobility, but only when deposited under high vacuum conditions. Some semiconducting polymers such as poly(3-hexylthiophene) (*Applied Physics Letters*, 1988, 53, 195) can be deposited from solution phase but this has not been found to be satisfactory for practical applications. Borsenberger et al., (*J. Appl. Phys.*, 34,1995, Pt 2, No12A, L1597–L1598), describes high mobility doped polymers comprising a bis(di-tolyaminophenyl)cyclohexane doped into a series of thermoplastic polymers, apparently of possible use as transport layers in xerographic photoreceptors. However, this paper does not show the usefulness of such materials in FETs.

There are further known approaches to use mixtures of organic materials in electronic devices. EP 0910100A2 (Xerox) describes compositions for conductive coatings, which comprise of a polymer binder, charge transport molecules and an oxidising agent. The oxidising agent is used to increase the carrier concentration. Such coatings may be envisaged as conductive electrodes for electronic devices, e.g. transistors such as gate, drain and source contacts or conductive tracks between them. However, the disclosure does not relate to the semiconductor channel material for FETs. U.S. Pat. No. 5,500,537 (Mitsubishi) claims FETs with at least two different organic channel materials, both of which are semiconductors, one compound having a higher conductivity than the other and used to supply carriers in the channel, thus achieving better current modulation. The application also mentions that a further "electrically insulating material" can be mixed in but without reference what such material may be or how it is applied. The carrier supply function of the first material can also be achieved when it forms a layer next to the second material.

EP0478380A1 (Toshiba) describes organic thin film elements consisting of a mixed stacked charge-transfer (CT) complex using a mixture of donor and acceptor like materials. The complex film can be affected to change its state from neutral to ionic by the application of an electric field. When used in an FET, the transition leads to an abrupt change in the carrier density in the channel. Multi-stack channels are also described using several double-layers of a CT complex layer followed by an insulating polyvinylidene fluoride (PVDF) layer. Such devices yield multiple-stage switching. The insulating PVDF is not used as a binder in the channel.

EP 0528 662 A1 (Toshiba) discloses an FET with a first organic layer constituting the FET channel and a second; adjacent layer with a different carrier concentration. The role of the second layer is to inject carriers into the channel when a voltage is applied to the gate. In one arrangement, the second organic layer can be made as a photoreceptor consisting of photogeneration and charge transport layers. The charge transport layer may consist of a charge transport material in a binder polymer. When the charge generation layer is illuminated, carriers are injected into the charge transport layer and subsequently into the first organic layer, which forms the channel. Thus a highly photosensitive switching element is obtained. The invention uses such charge generating/charge transporting layers solely as a second layer supplying excess carriers into the first organic layer (the channel) and does not suggest using binder compositions as the active channel layer itself.

EP 0981165 A1 (Lucent) describes thin film transistor integrated circuits with inverted structures. The document mentions that semiconductor materials used may be 4,4'-diaminobisphenyls in polymer matrices. U.S. Pat. No. 5,625,199 (Lucent) discloses complementary circuits with p and n type organic transistors. It also mentions that p-channel elements may be made of p,p'-diaminobisphenyl in polymer matrices. However neither document teaches what the polymer matrices may be and does not consider any other compounds than p,p'-diaminobisphenyls.

U.S. Pat. No. 3,963,498 (Eastman Kodak) discloses amine salts of linear polyaniline compounds as useful semiconductors. It also mentions that an organic binder may be added to the amine salt. However, the disclosure does not extend beyond the use of polyaniline salts. In our co-pending PCT patent application WO 99/32537 we disclose end-capped triarylamine polymers solutions of which may be used to make inter alia field effect transistors. We have now found that transistors with good performance characteristics may be conveniently produced by using binders described herein.

According to the present invention there is provided a field effect transistor in which a continuous semiconductor layer comprises:
a) an organic semiconductor; and
b) an organic binder which has an inherent conductivity of less than $10^{-6}$ Scm$^{-1}$ and a permittivity, $\epsilon$, at 1,000 Hz of less than 3.3.

The organic binder is preferably one in which at least 95%, more preferably at least 98% and especially all of the atoms are hydrogen, fluorine and carbon atoms.

Preferred binders are materials of low permittivity. The organic binder preferably has a permittivity at 1,000 Hz of less than 3.0, more preferably less than 2.8 and preferably greater than 1.7, especially a permittivity from 2.0 to 2.8.

Where the organic binder is a homopolymer of polystyrene its molecular weight is preferably less than 20,000 daltons, more preferably less than 15,000 daltons, and especially greater than 1,000 daltons.

In a preferred embodiment the organic semiconductor has a field effect mobility of more than $10^{-5}$ cm$^2$V$^{-1}$s$^{-1}$ and an inherent (i.e. when not exposed to an electric field) conductivity of less than $10^{-6}$ Scm$^{-1}$.

A preferred sub-group of field effect transistors comprise a continuous semiconductor layer which has a field effect mobility of more than $10^{-5}$ cm$^2$V$^{-1}$s$^{-1}$ and an inherent (i.e. when not exposed to an electric field) conductivity of less than $10^{-6}$ Scm$^{-1}$ which layer comprises:
a) an organic semiconductor having an inherent conductivity of less than $10^{-6}$ Scm$^{-1}$ and preferably a field effect mobility of more than $10^{-5}$ cm$^2$V$^{-1}$s$^{-1}$ and
b) an organic binder which has an inherent conductivity of less than $10^{-6}$ Scm$^{-1}$ and a permittivity at 1,000 Hz of less than 3 and more preferably less than 2.8 and preferably greater than 1.7, especially from 2.0 to 2.8 with the proviso that if the binder is a homopolymer of polystyrene its molecular weight is less than 20,000 daltons and preferably less than 15,000 daltons, and is preferably greater than 1,000 daltons.

A further preferred sub-group of field effect transistors comprise a continuous semiconductor layer which comprises:
a) an organic semiconductor and
b) a binder of which at least 95% and preferably at least 98% and preferably all of the atoms are hydrogen, fluorine and carbon atoms with the proviso that if the hydrocarbon binder is a homopolymer of polystyrene its molecular weight is less than 20,000 daltons and preferably less than 15,000 daltons, and is preferably greater than 1,000 daltons.

The semiconductor may be an n or p type.

The organic semiconductor may be any conjugated aromatic molecule containing at least three aromatic rings. Preferred organic semiconductors contain 5, 6 or 7 membered aromatic rings, especially preferred organic semiconductors contain 5 or 6 membered aromatic rings.

Each of the aromatic rings may optionally contain one or more hetero atoms selected from Se, Te, P, Si, B, As, N, O or S, preferably from N, O or S.

The rings may be optionally substituted with alkyl, alkoxy, polyalkoxy, thioalkyl, acyl, aryl or substituted aryl groups, a fluorine atom, a cyano group, a nitro group or an optionally substituted secondary or tertiary alkylamine or arylamine —N(R$^3$)(R$^4$), where R$^3$ and R$^4$ each independently is H, optionally substituted alkyl, optionally substituted aryl, alkoxy or polyalkoxy groups. The alkyl and aryl groups may be optionally fluorinated.

The rings may be optionally fused or may be linked with a conjugated linking group such as —C(T$_1$)=C(T$_2$)-, —C≡C—, —N(R')—, —N=N—, (R')=N—, —N=C (R')—. T$_1$ and T$_2$ each independently represent H, Cl, F, —C≡N or lower alkyl groups particularly C$_{1-4}$ alkyl groups; R' represents H, optionally substituted alkyl or optionally substituted aryl. The alkyl and aryl groups may be optionally fluorinated.

Other organic semi-conducting materials that can be used in this invention include soluble compounds and soluble derivatives of compounds of the following list: conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene; oligomeric para substituted phenylenes such as p-quaterphenyl (p-4P), p-quinquephenyl (p-5P), p-sexiphenyl (p-6P); conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines or naphthalocyanines; C$_{60}$ and C$_{70}$ fullerenes; N,N'-dialkyl, substituted dialkyl, diaryl or substituted diaryl-1,4,5,8-naphthalenetetracarboxylic diimide; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. A preferred class of semiconductors has repeat units of formula 1:

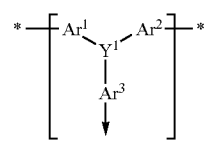

Formula 1 where each Y$^1$ is independently selected from P, S, As, N and Se and preferably Y$^1$ is N; Ar$^1$ and Ar$^2$ are aromatic groups and Ar$^1$ is present only if Y$^1$ is N, P, or As in which case it too is an aromatic group. Ar$^1$, Ar$^2$ and Ar$^3$ may be the same or different and represent, independently if in different repeat units, a multivalent (preferably bivalent) aromatic group (preferably mononuclear but optionally polynuclear) optionally substituted by at, least one optionally substituted C$_{1-40}$ carbyl-derived groups and/or at least one other optional substituent, and Ar$^3$ represents, independently if in different repeat units, a mono or multivalent (preferably bivalent) aromatic group (preferably mononuclear but optionally polynuclear) optionally substituted by at least one: optionally, substituted C$_{1-40}$ carbyl-derived group and/ or at least one other optional substituent; where at least one terminal group is attached in the polymer to the Ar$^1$, Ar$^2$ and optionally Ar$^1$ groups located at the end of the polymer chains, so as to cap the polymer chains and prevent further polymer growth, and at least one terminal group is derived from at least one end capping reagent used in the polymerisation to form said polymeric material to control the molecular weight thereof.

WO 99/32537 is a patent application of the applicants which describes certain novel oligomers and polymers which have repeat units of formula 1. In that invention polymers of this type are prepared by the addition of an end capping reagent to control the molecular weight of the final polymer and hence its desirable properties as a charge transport material. The disclosure of this application is incorporated herein by reference, as these materials are particularly useful as semiconductors in the present invention.

The number of repeat units of Formula 1-which may be present per molecule in the invention may be from 2 to 1,000, preferably from 3 to 100 and more preferably from 3 to 20 inclusive.

The preferred polymeric materials are obtainable by polymerisation controlled by the addition of at least one end capping reagent in an amount sufficient to reduce substantially further growth of the polymer chain.

The preferred polymeric materials are obtainable by polymerisation controlled by the addition of at least one end capping reagent in an amount sufficient to reduce substantially further growth of the polymer chain.

The asterisks extending from $Ar^1$ and $Ar^2$ in Formula 1 are intended to indicate that these groups may be multivalent (including divalent as shown in Formula 1). Other amine materials that may be useful in this invention are tetrakis (N,N'-aryl)biaryldiamines, bis(N,N'-[substitutedphenyl]), bis(N,N'-phenyl)-1,1'-bi-phenyl-4,4-diamines including 4-methyl, 2,4-dimethyl and/or 3-methyl derivatives thereof; triphenylamine and, its alkyl and aryl derivatives and poly(N-phenyl-1,4-phenyleneamine); N-dibenzo[a,d]cyclohept-tene-5-ylidene-N',N'-di-p-tolyl-benzene-1,4-diamine, (9,9-dimethyl-9H-fluorene-2-yl)-di-p-tolyl-amine and their derivatives. Related materials which may also be used in this invention are described in patent DE 3610649, EP 0669654-A (=U.S. Pat. No. 5,681,664), EP 0765106-A, WO 97-33193, WO 98-06773, U.S. Pat. No. 5,677,096and U.S. Pat. No. 5,279,916.

Conjugated oligomeric and polymeric heterocyclic semiconductors may comprise a repeat unit of an optionally substituted 5 membered ring and terminal groups $A^1$ and $A^2$ as shown in Formula 2:

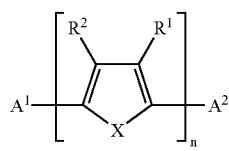

Formula 2 in which X may be Se, Te or preferably O, S, or —N(R)— where R represents H, optionally substituted alkyl or optionally substituted aryl; $R^1$, $R^2$, $A^1$ and $A^2$ may be independently H, alkyl, alkoxy, thioalkyl, acyl, aryl or substituted aryl, a fluorine atom, a cyano group, a nitro group or an optionally substituted secondary or tertiary alkylamine or arylamine —$(R^3)(R^4)$, where $R^3$ and $R^4$ are as defined above. The alkyl and aryl groups represented by $R^1$, $R^2$, $R^3$, $R^4$, $A^1$ and $A^2$ may be optionally fluorinated. The number of recurring units in the conjugated oligomer of Formula 2 is represented by an integer n, where n is preferably 2 to 14. Preferred oligomers have X=S, $R^1$ and $R^2$=H and $A^1$ and $A^2$=optionally substituted $C_{1-12}$ alkyl groups, examples of especially preferred compounds being $A^1$ and $A^2$=n-hexyl and where n=4, alpha-omega-n-hexylquaterthienylene (alpha-omega 4T), n=5, alpha-omega-n-hexylpentathienylene (alpha-omega -5T), n=6, alpha-omega-n-hexylhexathienylene (alpha-omega-6T), n=7, alpha-omega-n-hexylheptathienylene (alpha-omega-7T), n=8, alpha-omega-n-hexyloctathienylene (alpha-omega-8T), and n=9, alpha-omega-n-hexylnonathienylene (alphaornega-9T). Oligomers containing a conjugated linking group maybe represented by Formula 3:

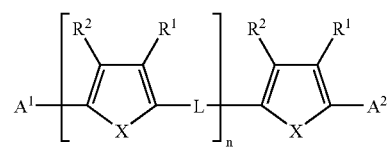

Formula 3 in which X may be Se, Te, or preferably O, S, or —N(R)—, R is as defined above; $R^1$, $R^2$, $A^1$ and $A^2$ as defined above for Formula 2. Linking group L represents —C($T_1$)=C($T_2$)—, —C≡C—, —N(R')—, —N=N—, (R')=N—, —N=C(R')— with $T_1$ and $T_2$ defined as above.

Polymers may have repeat units of the general Formula 4:

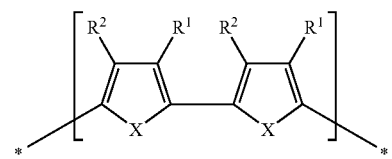

Formula 4 in which X, $R^1$ and $R^2$ are defined as above. The sub units may be polymerised in such a way as to give a regio regular or a regio random polymer comprising repeat units as shown in Formulae 4 to 6:

Formula 4

Formula 5

Formula 6

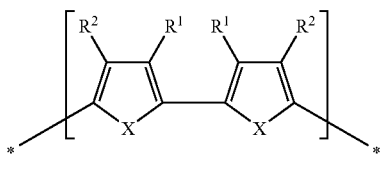

Polymers may have repeat units of the general Formula 7:

Formula 7

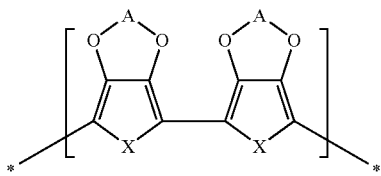

in which X is as defined above and the bridging group A is optionally fluorinated $C_{1-6}$ alkyl, for example poly(3,4-ethylenedioxy)thiophene-2,5-diyl and poly(3,4-trimethyldioxy) thiophene-2,5-diyl.

Polymers may have repeat units of general Formula 8:

Formula 8

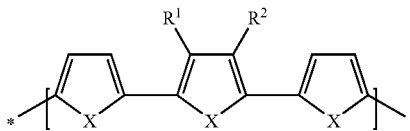

in which X, $R^1$ and $R^2$ are defined as above. Specific examples are where one of $R^1$ or $R^2$ is an alkoxide of general formula $C_nH_{2n+1}O$—, and the other of $R^1$ or $R^2$ is H, poly(?'-dodecyloxy-α,α',-α,α"terthienyl) i.e. polyDOT$_3$.

Polymers may have repeat units of general Formula 9:

Formula 9

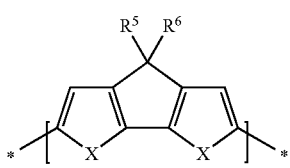

in which X is as defined above; $R^3$ and $R^6$ may be independently H, alkyl, aryl or substituted aryl. The alkyl and aryl groups may be optionally fluorinated.

Polymers may have repeat units of general Formula 10 in which $R^1$ and $R^6$ are as defined in Formula 9:

Formula 10

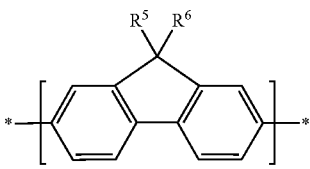

Copolymers comprising repeat, units as above described and also other repeat units comprising two or more of the repeat units could be used.

It is preferred that the binder normally contains conjugated bonds especially conjugated double bonds and/or aromatic rings. It should preferably form a film, more preferably a flexible film. Copolymers of styrene and alpha methyl styrene, for example copolymers of styrene, alpha methyl styrene and butadiene may suitably be used.

Binder materials of low permittivity have few permanent dipoles which could otherwise lead to random fluctuations in molecular site energies. The permittivity (dielectric constant) can be determined by the ASTM D150 test method.

It is desirable that the permittivity of the material has little dependence on frequency. This is typical of non-polar materials. Polymers and/or copolymers can be chosen by the permittivity of their substituent groups. A list of low polarity polymers suitable for use in the present invention is given (without limiting to these examples) in Table 1:

TABLE 1

| Binder | typical low frequency permittivity ε |
| --- | --- |
| polystyrene | 2.5 |
| poly(α-methylstyrene) | 2.6 |
| poly(α-vinylnaphtalene) | 2.6 |
| poly(vinyltoluene) | 2.6 |
| polyethylene | 2.2–2.3 |
| cis-polybutadiene | 2.0 |
| polypropylene | 2.2 |
| polyisoprene | 2.3 |
| poly(4-methyl-1-pentene) | 2.1 |
| poly(tetrafluoroethylene) | 2.1 |
| poly(chorotrifluoroethylene) | 2.3–2.8 |
| poly(2-methyl-1,3-butadiene) | 2.4 |
| poly(p-xylylene) | 2.6 |
| poly(α-α-α'-α' tetrafluoro-p-xylylene) | 2.4 |
| poly[1,1-(2-methyl propane)bis(4-phenyl)carbonate] | 2.3 |
| poly(cyclohexyl methacrylate) | 2.5 |
| poly(chlorostyrene) | 2.6 |
| poly(2,6-dimethyl-1,4-phenylene ether) | 2.6 |
| polyisobutylene | 2.2 |
| poly(vinyl cyclohexane) | 2.2 |

Other polymers include poly(4-methylstyrene), poly(1,3-butadiene) or polyphenylene. Copolymers containing the repeat units of the above polymers are also suitable. Copolymers offer the possibility of improving compatibility with the organic semiconductor, modifying the morphology and the glass transition temperature of the final composition. It will be appreciated that in the above table certain materials are insoluble in commonly used solvents. In these cases analogues can be used as copolymers. Some examples of copolymers are given in Table 2 (without limiting to these examples). Both random or block copolymers can be used.

It is also possible to add some more polar monomer components as long as the overall composition remains low in polarity.

TABLE 2

| Binder | typical low frequency permittivity ($\epsilon$) |
| --- | --- |
| poly(ethylene/tetrafluoroethylene) | 2.6 |
| poly(ethylene/chlorotrifluoroethylene) | 2.3 |
| fluorinated ethylene/propylene copolymer | 2–2.5 |
| polystyrene-co-α-methylstyrene | 2.5–2.6 |
| ethylene/ethyl acrylate copolymer | 2.8 |
| poly(styrene/10% butadiene) | 2.6 |
| poly(styrene/15% butadiene) | 2.6 |
| poly(styrene/2,4 dimethylstyrene) | 2.5 |

Other copolymers may include branched or non-branched polystyrene-block-polybutadiene, polystyrene-block(polyethylene-ran-butylene)-block-polystyrene, polystyrene-block-polybutadiene-block-polystyrene, polystyrene-(ethylene-propylene)-diblock-copolymers (e.g. KRATON®-G1701E, Shell), poly(propylene-co-ethylene) and poly(styrene-co-methylmethacrylate).

For p-channel FETs, it is desirable that the binder material should have a higher ionisation potential than the semiconductor, otherwise the binder may form hole traps. In n-channel materials the binder should have lower electron affinity than the n-type semiconductor to avoid electron trapping.

The binder may be formed in situ by dissolving the semiconductor in a liquid monomer, oligomer or crosslinkable polymer and depositing the solution for example by dipping, spraying, painting or printing it on a substrate to form a film and then curing the liquid monomer, oligomer or crosslinkable polymer, for example by exposure to radiation, heat or electron beams to produce a solid layer.

If a preformed binder is used it may be dissolved together with the semiconductor in a suitable solvent, and the solution deposited for example by dipping, spraying, painting or printing it on a substrate to form a film and then removing the solvent to leave a solid layer. Suitable solvents are chosen from those classes which are a good solvent for both the binder and organic semiconductor, and which upon evaporation from the solution blend give a coherent defect free film. Suitable solvents for the resin or organic semiconductor can be determined by preparing a contour diagram for the material as described in ASTM Method D 3132 at the concentration at which the mixture will be employed. The material is added to a wide variety of solvents as described in the ASTM method. Examples of organic solvents which may be considered are: $CH_2Cl_2$, $CHCl_3$, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin and/or mixtures thereof. After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p9–10, 1986". Such a procedure may lead to a blend of 'non' solvents that will dissolve both the binder and organic semi-conductor, although it is desirable to have at least one true solvent in a blend.

The proportions of binder to semiconductor are preferably 20:1 to 1:20, more preferably 10:1 to 1:10 and especially 5:1 to 1:5.

According to a further feature of the present invention there is provided a process for producing a field effect transistor which comprises the step of coating a substrate with a liquid layer which comprises an organic semiconductor, a binder and a solvent or which comprises an organic semiconductor and a material capable of reacting to form a binder and converting the liquid layer to a solid layer comprising the semiconductor and the binder by evaporating the solvent or by reacting the material to form the binder as the case may be, the binder being a film forming binder of which at least 95% and preferably least 98% and preferably all of the atoms are hydrogen, fluorine and carbon atoms or being an organic binder which has an inherent conductivity of less than $10^{-6}$ S/cm and a permittivity of less than 3.3, preferably less than 3 and more preferably less than 2.8 and preferably greater than 1.7, for example 2.0 to 2.8 with the proviso that if the hydrocarbon binder is homopolymer of polystyrene its molecular weight is less than 20,000 daltons and preferably less than 15,000 daltons and is preferably greater than 1000 daltons.

It is desirable to generate small structures in modern microelectronics to reduce cost (more devices/unit area), and power consumption. Patterning may be carried out by photolithography or electron beam lithography. Liquid coating of organic field effect transistors is more desirable than vacuum deposition techniques. The semiconductor compositions of the present invention enable the use of a number of liquid coating techniques. The organic semiconductor layer may be incorporated into the final device structure by dip coating, spin coating, ink jet printing, letter-press printing, screen printing, doctor blade coating; roller printing, reverse-roller printing; offset lithography printing, flexographic printing, web printing, spray coating, brush coating or pad printing.

Selected compositions of the present invention may be applied to prefabricated transistor substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar are used to apply the organic semiconductor layer. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing compositions must first be dissolved in a suitable solvent. Solvents must fulfil the requirements previously stated in this document and must not have any detrimental effect on the chosen print head. Additionally solvents should have boiling points >100° C., more preferably >150° C. in order to prevent operability problems caused by the solution drying out inside the print head. Suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

The inclusion of a polymeric binder in the organic semiconductor composition allows the viscosity of the coating solution to be tuned to meet the requirements of the particular print head. Preferred viscosities for ink jet printing are 1 to 25 mPa, more preferably 8 to 15 mPa, especially 3 to 15 mPa.

Direct patterning (printing) to form the features of the semiconductor device may be possible using liquid coating. This is simpler and less wasteful than subtractive methods such as photolithography. A summary of suitable non-lithographic techniques for fabricating high quality microstructures are detailed in Table 3 (without limiting to these examples) below (*Angew. Chem. Int. Ed.,* 1998, 37, 550–575).

TABLE 3

| Method | Resolution | Reference |
|---|---|---|
| Injection moulding | 10 nm | Huber et al., Appl. Phys. Lett., 1997, 70, 2502 |
| Embossing | 25 nm | S. Y. Chou et al., Appl. Phys. Lett., 1995, 67, 3114 |
| Cast molding | 50 nm | J. G. Kloosterboer, Philips Tech. Rev., 1982, 40, 198- |
| Laser ablation | 70 nm | M. A. Roberts et al., Anal. Chem. 1997, 69, 2035 |
| Micro-machining | 100 nm | G. M. Whitesides, Chem. Mater. 1994, 6, 596 |
| Laser deposition | 1 μm | A. Fisher et al. Adv. Mater. Opt. Electron. 1996, 6,27. |
| Electrochemical machining | 1 μm | M. Datta. J. Electrochem. Soc., 1995, 142, 3801 |
| Silver halide photography | 5 μm | CHEMTECH 1992, 22(7), 418 |
| Pad printing | 20 μm | Sens. Acc. A 41/42, 1994, 593 |
| Screen printing | 20 μm | Sens. Acc. A 43, 1994, 357 |
| Ink-jet printing | 50 μm | M. Doring., Philips Tech. Rev., 1982, 40, 192 CHEMTECH 1986, 16(5), 304 and C. Wu. Sci. News, 1997, 151, 205 |
| Electrophotography | 50 μm | Q. M. Pai. et al Rev. Mod. Phys. 1993, 65, 163 |
| Stereolithography | 100 μm | F. T. Wallenberger, Science, 1995, 267, 1274 |
| Microcontact printing | 35 nm | G. M. Whitesides, Annu. Rev. Mater. Sci., 1998, 28, 153. |
| Replica molding | 30 nm | G. M. Whitesides, Science, 1996, 273, 347 |
| Micro-transfer molding | 1 μm | G. M. Whitesides, Adv. Mater. 1996, 8, 837. |
| Micro-molding in capillaries | 1 μm | G. M. Whitesides, Nature, 1995, 376, 581. |
| Solvent assisted micro-molding | 60 nm | G. M. Whitesides, Adv. Mater. 1997, 9, 651. |

Whilst the substrates, types of insulation and the electrodes may be of conventional type it is preferred that the transistors should be made of flexible organic materials for the sake of robustness and resistance to physical stress.

The film in the transistor is suitably a continuous monolayer but may be thicker, preferably at most 50 microns and more preferably at most 1 micron thick.

The transistors may be of conventional design.

It is preferred that the ratio of the current flowing between the source and drain when no gate voltage is applied (off state) and the current flowing when a gate voltage is applied (on state) is preferably at least 1:10 and more preferably 1:1,000.

It is preferred that the film be amorphous. It may be a single phase, bicontinuous, phase separated or a dispersion of one or more component(s) in other(s). It may consist of one or more phases which may interpenetrate one another so that each is itself continuous phase. A first component a) may be a mixture of semiconductors as described in U.S. Pat. No. 5,500,537 and a second component b) may be a mixture of binders.

The transistors of this invention may be integrated into more complex devices as component parts.

EXAMPLES

All synthetic preparations were carried out under an atmosphere of dry deoxygenated dinitrogen. Dry flash column chromatography was used to purify the reaction products using suitable solvents (for example: hexane; toluene; etc.) as eluents. When necessary this process was repeated in order to obtain materials of acceptable electrical quality.

GPC analysis was carried out using PL mixed D gel columns; THF eluent; and polystyrene standards. The figures quoted are weight average molecular weights to the nearest 100 daltons with a confidence limit of +/−5% based on duplicate injections.

Preparation of Semiconductors

Example 1

Preparation of End Capped 2,4-dimethyl Polymer (Formula 12)

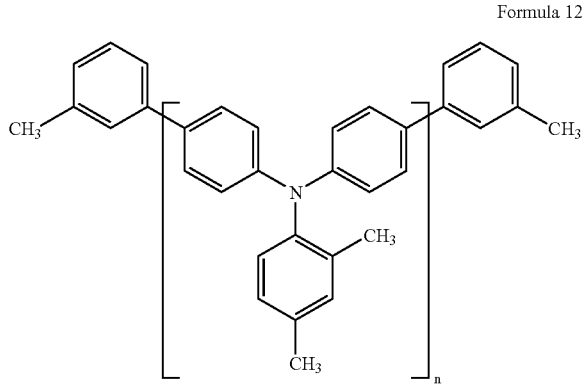

Formula 12

This material was prepared using the procedure described in WO 99/32537 to yield an off-white solid (20.2 g). ($M_w$=3100).

Example 2

Preparation of 2,4-dimethyl Polymer (Formula 13)

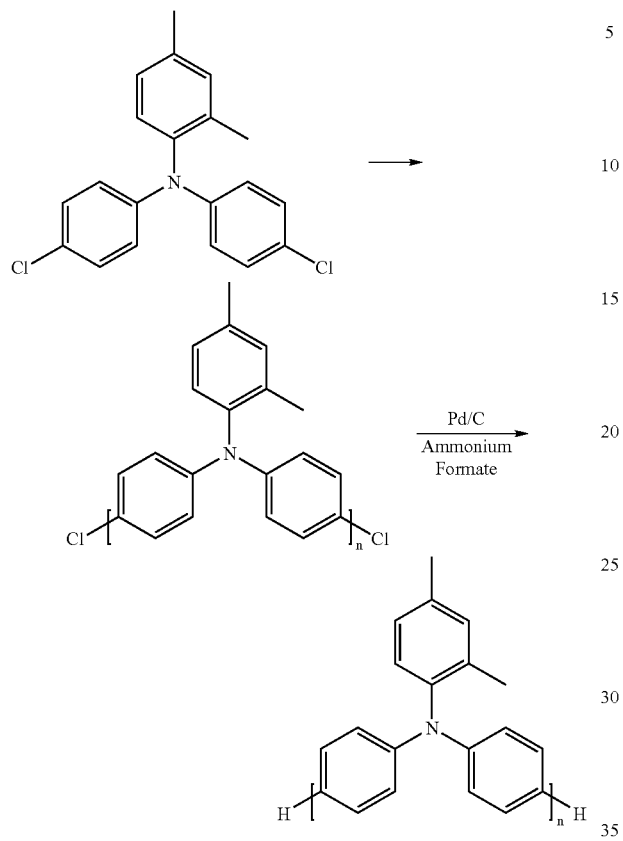

Nickel(II) chloride (0.97 g), zinc powder (59.1 g), triphenyl phosphine (39.3 g), 2,2'bipyridyl (1.76 g) and anhydrous N,N-dimethylacetamide (1000 ml) were charged to a 2 litre flask and heated with stirring to 80° C. and a deep red/brown solution was produced—characteristic of formation of the catalyst.

After 30 minutes at 80° C. the bis(N-4-chlorophenyl)-2, 4-dimethylphenylamine (100 g) was added. The oligomerisation was followed by HPLC. After a further 105 minutes the reaction mixture was cooled to room temperature. The reaction mixture was then poured into a 5 litre beaker together with toluene (250 mls). The residual zinc was, then destroyed by slow addition of concentrated hydrochloric acid to the stirred mixture. The organic layer was separated off and washed with water, saturated aqueous sodium bicarbonate solution and finally with water. The organic solution was then dried over magnesium sulfate and filtered. The filtrate was concentrated to yield a yellow solid. This was purified by dry flash column chromatography to yield a pale yellow solid (80.9 g). ($M_w$=7700).

A portion of the material prepared above was reduced using the following procedure.

10% Pd/C (12.5 g) and distilled water (145 mls) were charged to a 2 litre flask. The mixture was stirred thoroughly to give a suspension. Ammonium formate (100 g) was then added followed by a portion of the material prepared above [26 g dissolved in toluene (425 mls)]. After approximately one half of this toluene solution had been added the flask and contents were heated to 70° C. (frothing occurred). The remaining toluene solution was then added over 30 minutes. The temperature was maintained at 60–70° C. for 24 hours. After cooling to room temperature the mixture was filtered and the toluene solution separated off, washed with 3×500 ml water and concentrated. The resulting solid was dissolved in tetrahydrofuran (150 mls) and precipitated into stirred methanol (600 mls). After filtering off the solids they were washed with methanol and dried in a vacuum oven. The crude product was then purified by dry flash column chromatography to yield the final product as a pale yellow powder (23.8 g) Sample A.

Analysis: Cl content <50 ppm ($M_w$=7400)

Fractionation of 2,4-dimethyl Polymer (Formula 13).

The final product prepared above (Sample A) was fractionated as follows: It was dissolved in tetrahydrofuran (THF)(1 part) and added dropwise to stirred methanol (2 parts), the precipitate was filtered off and the filtrate concentrated to yield fraction one. Fractions two and three were similarly obtained by dissolving the first precipitate in THF (1 part) and precipitating into methanol (1.5 and 1 parts respectively).

The solid remaining after three precipitations was thoroughly dried and then dissolved in toluene. Hexane was added dropwise to the stirred toluene solution until a small amount of precipitate was produced. This precipitate was collected by filtration, washed with hexane and dried. A further 9 fractions were obtained by further addition of small amounts of hexane to the solution, removal of the precipitate and drying the precipitated solid. The final fraction was obtained by rotary evaporation of the residual solution.

A total of 13 fractions were obtained ranging from $M_w$=700 to. $M_w$=10000. All fractions were found to contain <50 ppm Cl.

Formula 13

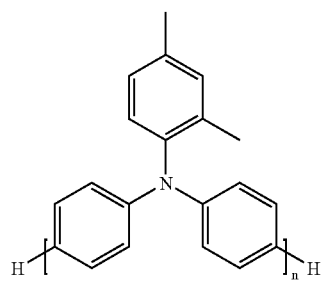

Example 3

Preparation of Fluorene Polymer (Formula 14)

i) Preparation of 2-bromo-9,9-dimethyl-9H-fluorene

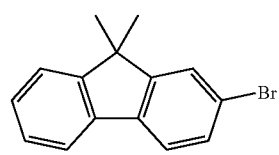

A 1 litre round bottomed flask was charged with 2-bromofluorene (50.0 g), potassium tert-butoxide (68.8 g) and anhydrous dimethyl sulfoxide (DMSO) (210 ml). The reaction mixture immediately became bright red in colour and an exotherm was observed. The reaction mixture was stirred for 30 minutes and then heated on a water bath to 40° C., after which iodomethane (69.5 g, 31 ml) was added dropwise over 3 hours, at a rate such that the temperature did not rise above 45° C. The reaction mixture, now bright purple, was maintained at 45° C. for a further 40 minutes, after which time the reaction was deemed complete. The reaction mixture was allowed to cool to room temperature and poured into a beaker containing distilled water (500 ml) and then extracted with dichloromethane (DCM) (4×300 ml). The aqueous fraction was discarded and the organic solution was washed successively with distilled water (4×300 ml), hydrochloric acid (2 M, 300 ml) and distilled water (300 ml). The organic extract was dried with anhydrous magnesium sulfate, concentrated under reduced pressure to yield a red oil. This was purified by dry flash, column chromatography (silica gel), to yield a yellow oil. Bulb-to-bulb distillation (200–215° C., 1.5 mm of Hg) failed to remove an unknown impurity, and the impure title compound was collected as a lime yellow oil (49.5 g, purity of 90 area % as determined by HPLC).

ii) Preparation of (4'-chlorophenyl)-(9,9-dimethyl-9H-fluoren-2-yl)-amine

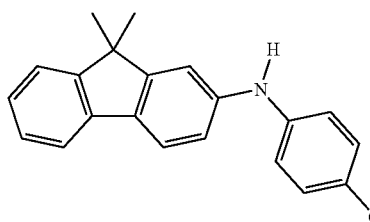

A 500 ml, 5-neck reaction flask was charged with 2-bromo-9,9-dimethyl-9H-fluorene (25.0 g) (as prepared above), 4-chloroaniline (12.9 g), sodium tert-butoxide (12.3 g), rac-2,2'-bis(diphenylphosphino)-1,1'-binaphthyl (rac-BINAP) (0.4 g), tris(dibenzylideneacetone)-dipalladium(0) (Pd$_2$(dba)$_3$) (0.2 g) and 1,4-dioxane (180 ml). This mixture was heated with stirring to 80° C. and held at this temperature for 66 hours, after which time the reaction was deemed complete as indicated by TLC analysis. The reaction mixture was allowed to cool to room temperature and then poured into a beaker containing hexane (1 litre). Residual solids were removed by filtration and the filter cake washed with hexane (300 ml). The combined organic filtrate and washings were concentrated to yield a black/brown oil which was purified by dry flash column chromatography. The title amine was isolated as a red/brown viscous oil. (12.8 g).

iii) Preparation of N,N-bis(4-chlorophenyl)-(9,9-dimethyl-9H-fluoren-2-yl)-amine

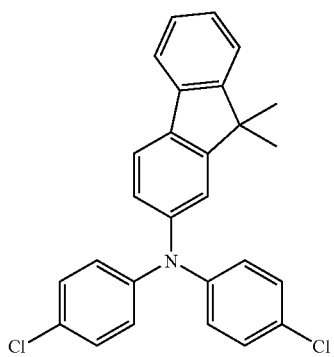

A 250 ml, 5-neck reaction flask equipped with a Dean-Stark apparatus was charged with 1-chloro-4-iodobenzene (14.4 g), (4'-chlorophenyl)-(9,9-dimethyl-9H-fluoren-2-yl)-amine (12.89), 1,10-phenanthroline (1.5 g) and oxylene (80 ml). The reaction mixture was heated rapidly with stirring to 100° C., and then copper(1) chloride (0.8 g) and potassium hydroxide flakes (18.0 g) were added. The resulting mixture was heated to 135° C. and held at this temperature for 2 hours. The mixture was allowed to cool to room temperature and poured into a beaker containing toluene (100 ml) and distilled water (100 ml). This mixture was filtered and the filter cake washed with toluene (100 ml). The combined organic filtrate and washings were separated and washed with distilled water (100 ml) and saturated aqueous sodium chloride solution (100 ml). The combined aqueous washings were back-extracted with toluene (100 ml), and then the combined organic extracts were dried with anhydrous magnesium sulfate and concentrated to yield a green viscous oil. This was purified by dry flash, column chromatography to yield as a white, crystalline powder, the title amine (13.8 g).

iv) Preparation of Fluorine Polymer (Formula 14).

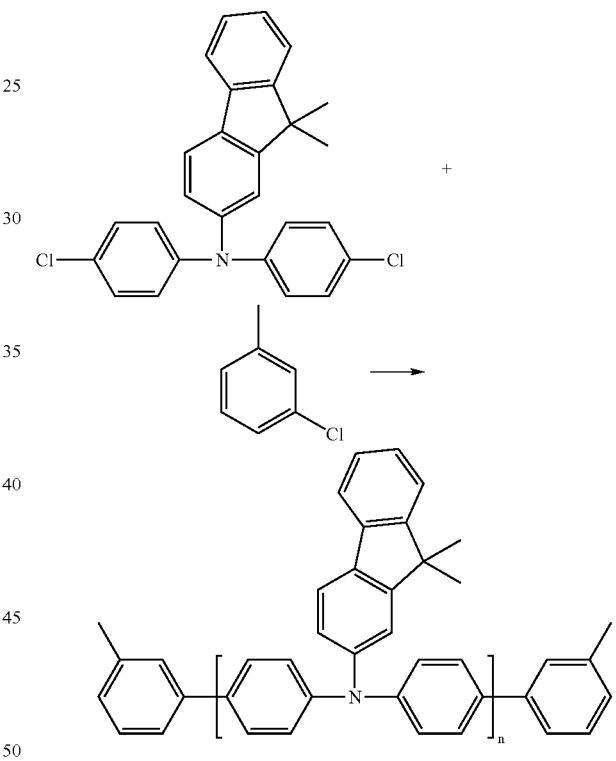

A 500 ml, 5-neck reaction flask was charged with nickel (II) chloride (0.1 g), zinc powder (6.0 g), 2,2'-bipyridyl (0.2 g), triphenylphosphine (3.9 g) and anhydrous, N,N-dimethylacetamide (120 ml). The reaction mixture was heated to 70° C., and after 40 minutes, a deep red/brown solution was observed which is characteristic of formation of the catalyst. The amine monomer and bis(N-4'-chlorophenyl)-(9,9-dimethyl-9H-fluoren-2-yl)-amine (12.6 g) was added and the resulting cardboard brown mixture was stirred and maintained at 75–80° C. for 3.5 hours. 1-chloro-3-methylbenzene (9.0 g) was added and the resulting mixture stirred for a further 45 hours to ensure the polymer was efficiently end capped, as indicated by HPLC analysis. The reaction mixture was allowed to cool to room temperature, diluted with toluene (150 ml), cooled to 0° C. Concentrated hydrochloric acid (30 ml) was added cautiously to the mixture to destroy excess zinc. The two-phase mixture was separated and the aqueous fraction discarded. The organic fraction was washed successively with distilled water (100 ml), saturated aqueous sodium hydrogen carbonate solution (100 ml) and saturated aqueous sodium chloride solution (100 ml). The organic fraction was then dried with anhydrous magnesium sulfate, filtered and concentrated to yield a viscous, greenish yellow oil. The oil was dissolved in tetrahydrofuran (THF) (150 ml) and added to methanol (600 ml). The resulting precipitate was collected, washed with further methanol (100 ml) and dried under vacuum. The crude product was purified by dry flash column chromatography (silica gel) to yield the product as a yellow powder (7.8 g). $M_w$=3700. Cl content 0.4% w/w.

Formula 14

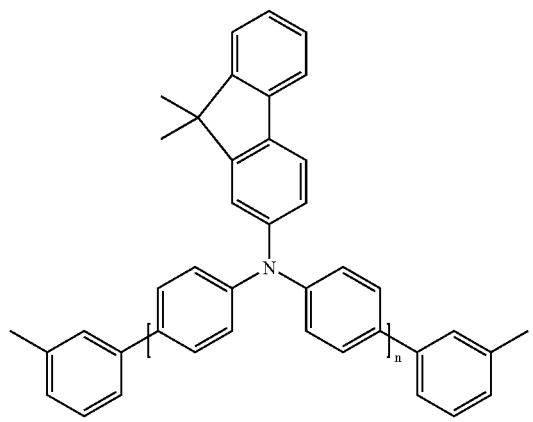

Example 4

Preparation of Fluorene Co-Polymer (Formula 15)

i) Preparation of 2,7-dibromo-9,9-di-n-octyl-9H-fluorene

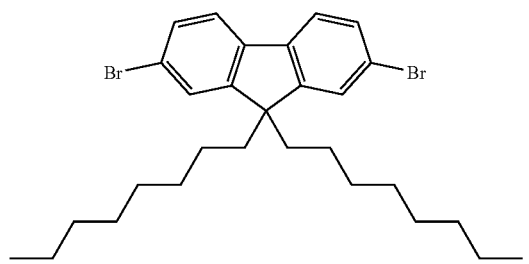

A 1 litre, 5-neck reaction flask was charged with 2,7-dibromofluorene (100.0 g), anhydrous DMSO (200 ml), benzyltriethylammonium chloride (3.9 g) and 100 ml of a 50 weight percent aqueous solution of sodium hydroxide. The reaction mixture immediately became bright orange in colour. 1-Bromooctane (179.0 g, 160 ml) was added dropwise over 30 minutes. The addition was mildly exothermic. On completion of the addition the mixture was heated to 90° C. and held at this temperature for 2 days. The mixture was then refluxed for a further 4 days after which time the reaction was deemed complete. The reaction mixture was then poured into a beaker containing distilled water (300 ml) and extracted with diethyl ether (400 ml). The organic extract was washed successively with saturated aqueous sodium chloride solution (100 ml) and distilled water (2×100 ml). The extract was dried with anhydrous magnesium sulfate and then concentrated to yield a yellow syrup, which solidified upon standing. The solid was crystallised from a mixture of acetone and methanol to yield the product (109.0 g).

ii) Preparation of 2,7-(9,9-di-n-octyl-9H-fluoren-2-yl)-bis[1,3,2]dioxaborolane

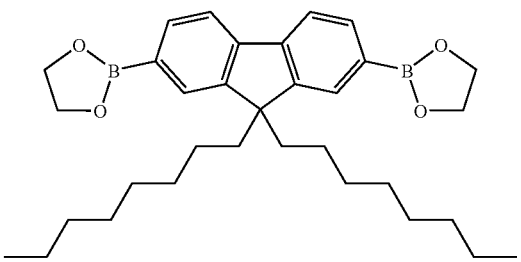

A 500 ml, 5-neck reaction flask was charged with 2,7-dibromo-9,9-di-n-octyl-9H-fluorene (20.0 g) and anhydrous THF (200 ml). The mixture was cooled to −78° C. and a 2.5 M solution of n-butyllithium in hexane (29 ml) was added dropwise over 0.10 minutes. An orange precipitate formed and the resulting slurry was stirred at −78° C. for 2 hours. Triisopropyl borate (34 ml) was added followed by THF (50 ml). The resulting mixture was stirred at −78° C. for a further 1.5 hours before it was allowed to warm to room temperature and stirred for a further 18 hours. The reaction mixture was then poured into a beaker containing hydrochloric acid (2 M, 540 ml) at −5° C. and stirred for 1 hour. The reaction mixture was then extracted with diethyl ether (500 ml). The organic extract was separated, washed with saturated aqueous sodium chloride solution (250 ml) and dried with anhydrous magnesium sulfate. The solution was concentrated to yield a gelatinous residue (19.2 g). This was suspended in toluene (250 ml) and transferred to a 500 ml, 5-neck reaction flask equipped with an overhead stirrer and a Dean-Stark apparatus fitted with a reflux condenser. Ethanediol (ethylene glycol) (6.8 g) was added and the resulting mixture refluxed for 3 hours. During this time, 120 ml of toluene was collected as over-head along with a small amount of water formed during the reaction. The reaction mixture was then concentrated. The resulting yellow oil was dissolved in hexane (50 ml) and cooled to 0° C. A precipitate-formed which was collected by vacuum filtration. This material was recrystallised from hexane and dried under vacuum to give, as a white powder, the title compound (6.8 g).

iii) Preparation of N,N-bis(4'-bromophenyl)-4-sec-butylphenylamine

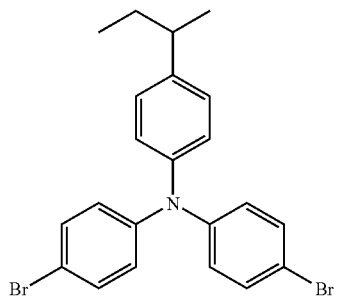

A 250 ml, 5-neck reaction flask equipped with an overhead stirrer and a Dean-Stark apparatus fitted with a reflux condenser was charged with 4-sec-butylaniline (18.8 g), 1-bromo-4-iodobenzene (106.9 g), 1,10-phenanthroline (4.5 g) and oxylene (100 ml). The reaction mixture was heated rapidly with stirring to 110° C. and then copper(1) chloride. (2.5 g) and potassium hydroxide flakes (40.3 g) were added. The mixture was heated at 149° C. for 3 hours, cooled to room temperature and then poured into a beaker containing toluene (100 ml) and distilled water (100 ml). The two phase mixture was filtered and then the organic layer was separated. The organic layer was washed with distilled water (100 ml) and saturated aqueous sodium chloride solution (100 ml). The combined aqueous phases were back-extracted with toluene (100 ml), and the combined organic extracts were dried with anhydrous magnesium sulfate and concentrated to yield a dark brown solid. This crude product was purified by dry flash, column chromatography (silica gel) to yield a colourless oil which crystallised on standing. This solid was recrystallised from a mixture of acetone and ethanol to give, as white needles, the title amine (23.8 g).

iv) Preparation of Co-Polymer (Formula 15)

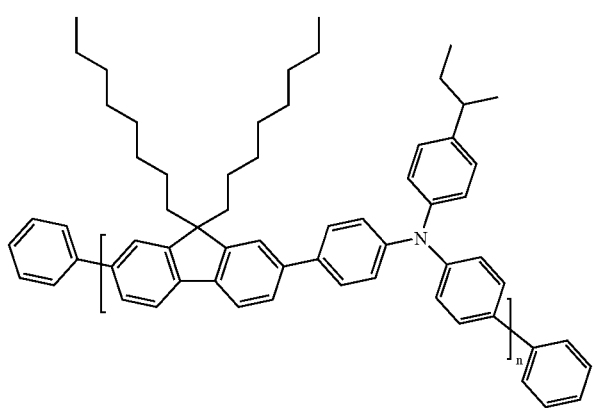

Formula 15

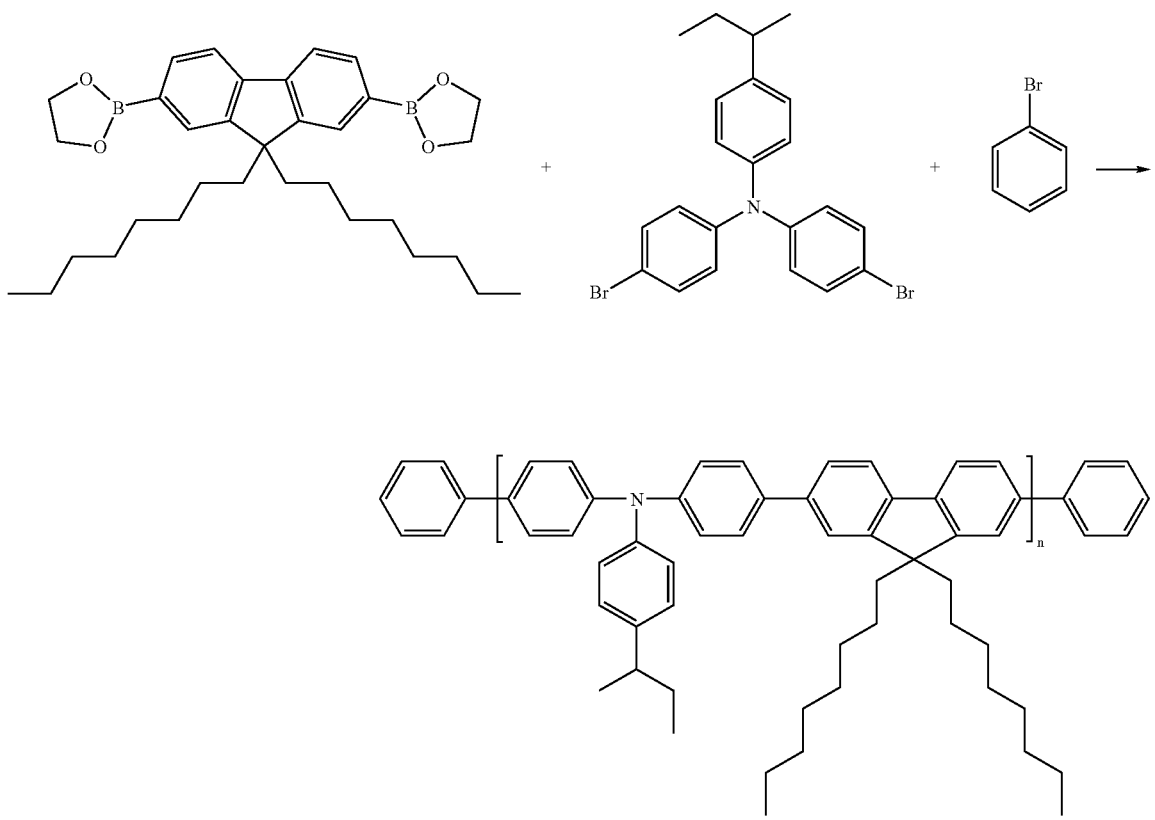

A 250 ml, 5-neck reaction flask was charged with N,N-bis(4'-bromophenyl)-4-sec-butylphenylamine (2.8 g), 2,7-(9,9-di-n-octyl-9H-fluoren-2-yl)-bis[1,3,2]dioxaborolane (3.2 g), toluene (45 ml), ALIQUAT 336® (1 g), tetrakis(triphenylphosphine)palladium(0) (0.1 g) and aqueous sodium carbonate solution (2 M, 10 ml). The resulting mixture was heated at gentle reflux for 20 hours. Bromobenzene (1.5 g) was then added and reflux continued for a further 1 hour. The reaction mixture was allowed to cool to room temperature and then added to 1 litre of a mixture of methanol and water (in a respective volume ratio of 9 to 1). The resulting green, fibrous precipitate was collected, washed with further methanol (200 ml), and dried. This material was dissolved in toluene (200 ml) and washed successively with distilled water (200 ml), hydrochloric acid (6 M, 2×120 ml), distilled water (200 ml), a 10 volume percent aqueous solution of ethylenediamine (2×100 ml), distilled water (200 ml), hydrochloric acid (2 M, 150 ml), and distilled water (200 ml). The organic layer was concentrated. The crude product was purified by dry flash, column chromatography (silica gel) to yield to yield a yellow powder (3.1 g). $M_w$=37900.

Example 5

Preparation of N,N-bis(4-tolyl)-(9,9-bimethyl-9H-fluorene-2-yl)-amine (Formula 16)

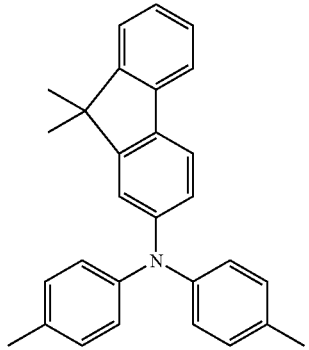

Formula 16

Di-p-tolylamine (21.25 g) was stirred to solution with toluene (200 ml). Sodium t-butoxide (12.07 g), tris(dibenzylideneacetone)dipalladium(0) (0.897 g) and tri-o-tolylphosphine (1.092 g) were added to the stirred solution. The resulting mixture was heated at 100° C. for 2 hours, cooled to ambient temperature and diluted with dichloromethane (600 ml). The mixture was washed with brine (200 ml), dried over magnesium sulphate, filtered and concentrated to yield the crude product as a brown oily solid (48.87 g). The crude product was purified by dry flash column chromatography to yield the product as a light yellow solid (22.9 g)

Example 6

Preparation of Co-Polymer of 9,9 di-2-ethylhexylfluorene and Bithiophene (Formula 17)

A 10 ml, 3-neck reaction flask was charged with 2,7-bis (1,3,2-dioxaborolan-2-yl)-9,9'-(2-ethylhexyl)fluorene (0.5 g), 5,5'-dibromo-2,2'-bithiophene (0.3 g), potassium phosphate (35% w/w aqueous solution, 0.81 g), dioxane (4.2 ml) and toluene (1.4 ml). Palladium(II) acetate (0.2 mg) and tri(o-tolyl)phosphine (1.6 mg) was then added and the reaction mixture was refluxed for three hours. The mixture was then cooled to room temperature and stirred for a further 16 hours. The reaction mixture was then decanted to give a solid residue (A) and a dark yellow solution (B). The solution (B) was washed sequentially with dilute hydrochloric acid (2M, 5 ml) and water (3×30 ml). It was then concentrated to yield an orange solid (0.34 g); $M_w$=20600.

The solid residue (A) was dissolved in tetrahydrofuran (20 ml) and precipitated into stirring methanol (400 ml). The resulting solid was collected by filtration, dissolved in toluene (20 ml) and purified by dry flash column chromatography (silica gel) to yield an orange solid (0.15 g). $M_w$=52700.

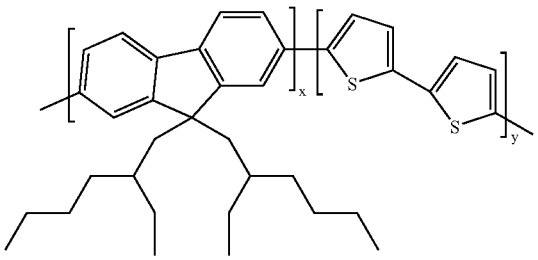

Formula 17

Example 7

Preparation of Regioregular Poly(3-hexylthiophene) (Formula 18)

Regioregular poly(3-hexylthiophene) was prepared according to the procedure described by R. D. McCullough and R. S. Loewe in U.S. Pat. No. 6,166,172. 180 mg of pure material was isolated. $M_w$=21800.

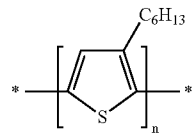

Formula 18

Example 8

Preparation of Co-Polymer of 9,9-dioctylfluorene and Bithiophene (Formula 19).

A 10 ml, 3-neck reaction flask was charged with 2,7-Bis (1,3,2-dioxaborolan-2-yl)-9,9'-dioctylfluorene (0.5 g), 5,5'-dibromo-2,2'-bithiophene (0.3 g), potassium phosphate (35% w/w aqueous solution, 0.81 g), dioxane (4.2 ml) and toluene (1.4 ml). Palladium(II) acetate (0.2 mg) and tri (otolyl)phosphine (1.6 mg) was then added and the reaction mixture was refluxed for 14 hours. The reaction mixture was diluted with toluene (50 ml) and the organic layer was separated from the residual solid. This solution was washed sequentially with dilute hydrochloric acid (2M, 10 ml), water (3×50 ml) and then concentrated to yield an orange solid. The solid was dissolved in toluene (10 ml) and purified by dry flash column chromatography (silica gel) to yield an orange solid (0.33 g). $M_w$=17300.

Formula 19

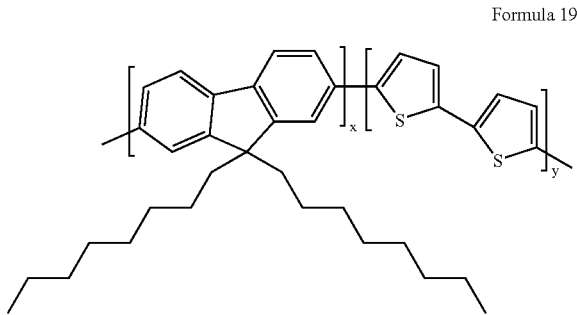

All other semiconductors tested were used as supplied from commercial sources, namely:
'syntec'=triarylamine oligomer (Syntec CAS no. 65181-78-4)
'syntec 2'=2,9-di(pent-3-yl)-anthra[2,1,9-def:6,5,10-d'e'f']diisoquinoline-1,3,8,10-tetro (CAS # 110590-81-3, ex. Syntec)
'takasago'=1,1-diphenyl-4,4-bis(paradiethylaminophenyl)-butadiene (ex. Takasago)

Determination of the Field Effect Mobility

The field effect mobility of the materials was tested using the techniques described by Holland et al, *J. Appl. Phys.*, 1994, 75, 7954.

In the following examples a test field effect transistor was manufactured by using a silicon crystal serving as substrate and also as the gate electrode. The silicon wafer was highly doped, conductive and had an insulating 200 nm thick $SiO_2$ layer which acts as the gate dielectric. Two gold electrodes are formed on the surface of the semiconductor to serve as the drain and the source. Appropriate mixtures of semiconductor and binder were dissolved in an appropriate solvent (toluene unless otherwise stated in the footnotes to the Table) and the solution was spin-coated onto such a prefabricated transistor substrate to yield a layer of 100–200 nm upon drying, achieved by baking at 100° C. in an oven for complete drying (see Table). Binders were all commercial grade as follows:
1=Polycarbonate Z20 (ESPRIT CAS# 25135-52-8)
2=Poly-4-methylstyrene (Aldrich cat. no. 18,227-3)
3=Polystyrene co-alphamethylstyrene (Aldrich cat. no. 45,721-3)
4=Poly-alphamethylstyrene (Aldrich, Cat. No. 19,184-1)
5=KRATON G1701E (polystyrene-(ethylene-propylene) diblock (Univar)

The advantage of such a test structure is that all elements are pre-formed and the active organic layer can be applied in a single step. Thus devices made of different materials can be easily and reliably compared. Defining parameters of the transistor are the length of the drain and source electrodes facing each other (W=20 mm) and their distance from each other (L=10 m).

Custom made silicon-based transistor substrates were used for testing all material compositions. Typically one part organic semiconductor composition was dissolved in 99 parts toluene or THF by weight. The solution was spin coated onto the Si wafer and left to dry for 1 minute. Further drying followed at 100° C. for 20 minutes. After this the device was ready for electrical tests.

The voltages applied to the transistor are relative to the potential of the source electrode. In the case of an p type gate material, when a negative potential is applied to the gate, positive charge carriers (holes) are accumulated in the semiconductor on the other side of the gate dielectric. (For an n channel FET, positive voltages are applied). This is called the accumulation mode. The capacitance/area ($C_i$) of the gate dielectric determines the amount of the charge thus induced. When a negative potential ($V_{DS}$) is applied to the drain, the accumulated carriers yield a source-drain current ($I_{DS}$) which depends primarily on the density of accumulated carriers and, importantly, their mobility in the source-drain channel. Geometric factors such as the drain and source electrode configuration, size and distance also affect the current. Typically a range of gate and drain voltages are scanned during the study of the device. The source-drain current is described by equation 1.

$$I_{DS} = \frac{\mu W C_i}{L}\left((V_G - V_O)V_{DS} - \frac{V_{DS}^2}{2}\right) + I_\Omega, \qquad \text{eq. 1}$$

where $V_O$ is an offset voltage and $I_\Omega$ a is an ohmic current independent of the gate voltage and is due to the finite conductivity of the material. The other parameters have been described above.

For the electrical measurements the transistor sample was mounted in a sample holder. Microprobe connections were made to the gate, drain and source electrodes using Karl Suss PH100 miniature probe-heads. These were linked to a Hewlett-Packard 4155B parameter analyser. The drain voltage was set to −2 V and the gate voltage was scanned from +2 to −20 V in 0.5 V steps. When $|V_G|>|V_{DS}|$ the source-drain current varies linearl with $V_G$. Thus the field effect mobility can be calculated from the gradient of $I_{DS}$ vs. $V_G$ given by equation 2.

$$S = \frac{\mu W C_i V_{DS}}{L}. \qquad \text{eq. 2}$$

All field effect mobilities quoted below were calculated from this regime (unless stated otherwise). The ratio of on-state current ($I_{on}$) vs. off-state current ($I_{off}$) was determined using the following conditions.

$I_{ON}=I_{DS}$ at $V_{DS}$=−20 V, $V_G$=−20 V $I_{OFF}=I_{DS}$ at $V_{DS}$=−20 V, $V_G$=0 V

Field effect mobilities may be measured directly in the case of organic semiconductors which form films. If they do not do so they may be estimated by forming a series of films containing differing amounts of the organic semiconductor and binder, measuring the field effect mobility for each film and extrapolating the results to a composition of 100% organic semiconductor.

In three cases in the Table a method of measuring the mobility was used as described by Dimitrakopoulos et al. in *Synthetic Metals* 1998 pp. 47–52. The drain, source and gate electrodes were connected to the Hewlett-Packard 4155B parameter analyser. In two cases $V_D$ was held at −20V and $V_G$ was scanned from 0 to −20V and back again, and in the third $V_D$ was held at +40V and $V_G$ was scanned from 0 to +40V and back again. For $V_D$ more negative than $V_G$, $I_D$ tends to saturate (saturation regime) due to the pinch-off in the accumulation layer, and is modelled by equation 3.

$$I_D = \frac{WC_i}{2L}\mu(V_G - V_T)^2. \quad \text{Equation 3}$$

$V_T$ is a threshold voltage (see reference above). The other parameters have been described previously. For this case $\mu$ can be calculated from the slope of the plot of $|I_D|^{1/2}$ versus $V_G$ using eqn 3.

| Example No. | semiconductor formula (s-c) | binder (b) | wt:wt ratio (s-c:b) | $V_G$ | $V_{DS}$ ($V_D$) | mobility | $I_{ON}/I_{OFF}$ |
|---|---|---|---|---|---|---|---|
| 9 | 12 | 3 | 1:1 | −20 | −20 | $10^{-4}$ | 5470 |
| 10[1] | 12 | 3 | 1:1 | −20 | −20 | $10^{-4}$ | 3900 |
| 11 | 12 | 4 | 1:1 | −7 | −2 | $6 \times 10^{-5}$ | 4340 |
| 12 | 12 | 5 | 1:1 | −8 | −2 | $6 \times 10^{-5}$ | 100 |
| 13 | 12 | 4 | 3.28:1 | −6 | −2 | $9 \times 10^{-5}$ | 3700 |
| 14 | 12 | 4 | 20:1 | −6 | −2 | $2.4 \times 10^{-4}$ | 237 |
| 15 | 13[2] | 1 | 10:1 | −6 | −2 | $3.3 \times 10^{-4}$ | 192 |
| 16 | 13[2] | 3 | 50:5.5 | −5 | −2 | $5.3 \times 10^{-4}$ | 34.4 |
| 17 | 13[2] | 1 | 1:1 | −10 | −2 | $1 \times 10^{-4}$ | 493 |
| 18 | 13[2] | 3 | 15.9:16.7 | −5 | −2 | $1.6 \times 10^{-4}$ | 236 |
| 19 | 14 | 1 | 43.2:5.6 | −10 | −2 | $1.5 \times 10^{-4}$ | 1530 |
| 20 | 14 | 3 | 28.2:2.9 | −5 | −2 | $3 \times 10^{-4}$ | 148 |
| 21 | 14 | 1 | 16:14.5 | −10 | −2 | $5.2 \times 10^{-5}$ | 2010 |
| 22 | 14 | 3 | 12.5:13.8 | −6 | −2 | $1.2 \times 10^{-4}$ | 14700 |
| 23[3] | 15 | 2 | 39.1:4.3 | 0 to −20 to 0 | −20 | $6 \times 10^{-5}$ | 14000 |
| 24 | 16 | 3 | 94.2:5.3 | −17 | −2 | $2.6 \times 10^{-5}$ | 7930 |
| 25 | syntec | 2 | 61.1:5.2 | −12 | −2 | $2.4 \times 10^{-5}$ | 32000 |
| 26 | takasago | 3 | 43.1:4.1 | −4 | −2 | $1 \times 10^{-5}$ | 2930 |
| 27 | 17 | 2 | 9.2:3.0 | −38 | −20 | $1 \times 10^{-4}$ | 7100 |
| 28[4] | syntec 2 | 4 | 9:1 | 0 to +40 to 0 | +40 | $1.8 \times 10^{-5}$ | 473 |
| 29[5] | 18 | 3 | 21.2:6.4 | 0 to −20 to 0 | −20 | $7 \times 10^{-5}$ | 1.5 |
| 30[6] | 12 | 4 | 1:1 | −10 | −2 | $5.6 \times 10^{-5}$ | 16400 |
| 31 | 13 & 19 (9:5 wt:wt) | 4 | (27 & 15):5.2 | −22 | −20 | $8.1 \times 10^{-5}$ | 5900 |

Footnotes:
[1] solvent used for deposition was THF
[2] $M_W$ fraction 2500
[3] method used for measurement was that described by Dimitrakopoulos
[4] method used for measurement was that described by Dimitrakopoulos
[5] solvent used for deposition was chlorobenzene; method used for measurement was that described by Dimitrakopoulos
[6] solvent used for deposition was anisole. The solution was ink jet printed through an industrial drop-on-demand peizoelectric print head onto a prefabricated transistor substrate.

The invention claimed is:

1. A field effect transistor in which a continuous semiconductor layer forms a field effect channel between a source electrode and a drain electrode, wherein the continuous semiconductor layer comprises:
   a) an organic semiconductor which is a conjugated aromatic molecule containing at least four aromatic rings; and,
   b) an organic binder which has an inherent conductivity of less than $10^{-6}$ Scm$^{-1}$ and a permittivity at 1,000 Hz of less than 3.0;
with the proviso that the organic semiconductor does not comprise 2,5-di-n-octyloxy-1,4-bis((4',4"-bisstyryl)styrylbenzene)(Ooct-OPV5).

2. A field effect transistor according to claim 1 wherein the organic semiconductor has inherent conductivity of less than $10^{-6}$ Scm$^{-1}$.

3. A field effect transistor according to claim 2 wherein the organic binder is a homopolymer of styrene and its molecular weight is less than 20,000 daltons.

4. A field effect transistor according to claim 1 wherein the organic binder has a permittivity of less than 2.8.

5. A process of producing a field effect transistor according to claim 1 which comprises:
   a) coating a substrate with a liquid layer which comprises the organic semiconductor, the binder and a solvent or which comprises the organic semiconductor and a material capable of reacting to form the binder; and
   b) converting the liquid layer to a solid layer comprising the semiconductor and the binder by evaporating the solvent or by reacting the material to form the binder as the case may be.

6. A field effect transistor in which a continuous semiconductor layer forms a field effect channel between a source electrode and a drain electrode, wherein the continuous semiconductor layer comprises:
   a) an organic semiconductor; and,
   b) an organic binder which has an inherent conductivity of less than $10^{31\ 6}$ Scm$^{-1}$ and a permittivity at 1,000 Hz of less than 3.0;
with the proviso that the organic semiconductor does not comprise 2,5-di-n-octyloxy-4-bis((4',4"-bisstyryl)styrylbenzene)(Ooct-OPV5) or a liquid crystalline phenyl naphthalene compound.

7. A field effect transistor according to claim 1 or claim 6 wherein said continuous semiconductor layer comprises an organic semiconductor having an inherent conductivity of less than $10^{-6}$ Scm$^{-1}$ and a field effect mobility of more than $10^{-5}$ cm$^2$V$^{-1}$s$^{-1}$ and the organic binder has an inherent conductivity of less than $10^{-6}$ Scm$^{-1}$ and a permittivity at 1,000 Hz of from 2.0 to 2.8 with the proviso that if the binder is a homopolymer of polystyrene its molecular weight is less than 20,000 daltons and greater than 1,000 daltons.

8. A field effect transistor in which a continuous semiconductor layer forms a field effect channel between a source electrode and a drain electrode, wherein the continuous semiconductor layer comprises:
   a) an organic semiconductor; and,
   b) an organic binder which has an inherent conductivity of less than $10^{31\ 6}$ Scm$^{-1}$ and a permittivity at 1,000 Hz of less than 3.0;
with the proviso that the organic semiconductor does not comprise 2,5-di-n-octyloxy-4-bis((4,',4"-bisstyryl)styrylbenzene)(Ooct-OPV5), said semiconductor being selected from the group consisting of:
   (a) compounds having repeat units of Formula 1:

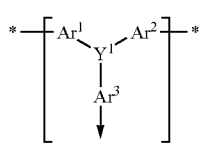

Formula 1 where each $Y^1$ is independently selected from P, S, As, N and Se; $Ar^1$ and $Ar^2$ are aromatic groups and $Ar^3$ is present only if $Y^1$ is N, P, or As in which case it too is an aromatic group;
   (b) conjugated oligomeric and polymeric heterocyclic compounds comprising a repeat unit of an optionally substituted 5-membered ring and terminal groups $A^1$ and $A^2$ as shown in Formula 2:

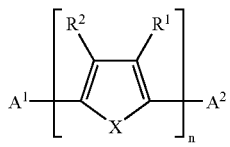

Formula 2 in which X may be Se, Te, O, S, or —N(R)— where R represents H, optionally substituted alkyl or optionally substituted aryl; $R^1$, $R^2$, $A^1$ and $A^2$ may be independently H, alkyl, alkoxy, thioalkyl, acyl, aryl or substituted aryl, a fluorine atom, a cyano group, a nitro group or an optionally substituted secondary or tertiary alkylamine or arylamine —N($R^3$)($R^4$), where $R^3$ and $R^4$ are independently H, optionally substituted alkyl, optionally substituted aryl, alkoxy or polyalkoxy groups;
   (c) oligomers containing a conjugated linking group of Formula 3:

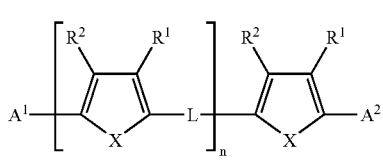

Formula 3 in which X may be Se, Te, O, S, or —N(R)—, R is as defined above; $R^1$, $R^2$, $A^1$ and $A^2$ as defined above for Formula 2, Linking group L represents —C($T_1$)=C($T_2$)-, —C=C, —N(R')—, —N=N—, (R')=N—, —N=C(R')— with $T_1$ and $T_2$ defined as above;
   (d) polymers having repeat units of Formula 4:

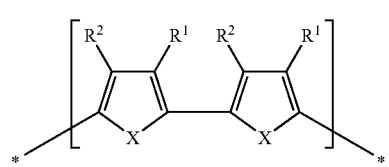

Formula 4 in which X, $R^1$ and $R^2$ are defined as above;
   (e) polymers having repeat units of Formula 7:

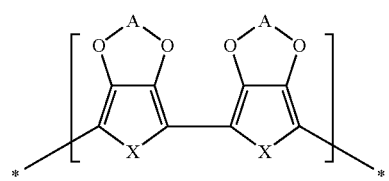

Formula 7 in which X is as defined above and the bridging group A is optionally fluorinated $C_{1-6}$ alkyl;
   (f) polymers having repeat units of Formula 8:

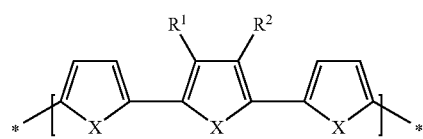

Formula 8 in which X, $R^1$ and $R^2$ are defined as above;
   (g) polymers having the repeat units of Formula 9:

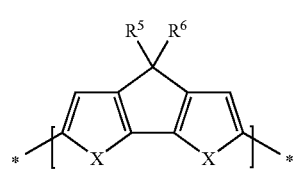

Formula 9 in which X is as defined above; $R^5$ and $R^6$ may be independently H, alkyl, aryl or substituted aryl;

(h) polymers having the repeat units of Formula 10:

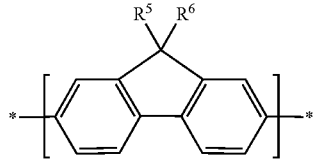

Formula 10 wherein $R^5$ and $R^6$ are as defined in Formula 9.

9. A field effect transistor comprising:
an insulator layer,
a gate electrode,
a semiconductor layer,
a source electrode,
a drain electrode,
wherein the semiconductor layer is as defined in any one of the preceding claims.

10. A field effect transistor according to claim 9, wherein the gate electrode and the semiconductor layer contact the insulator layer, and the source electrode and the drain electrode contact the semiconductor layer.

* * * * *